United States Patent
Hasebe et al.

(10) Patent No.: US 8,119,544 B2
(45) Date of Patent: Feb. 21, 2012

(54) FILM FORMATION METHOD AND APPARATUS FOR SEMICONDUCTOR PROCESS

(75) Inventors: Kazuhide Hasebe, Yamanashi (JP); Nobutake Nodera, Osaka (JP); Eun-jo Lee, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 107 days.

(21) Appl. No.: 12/318,702

(22) Filed: Jan. 6, 2009

(65) Prior Publication Data

US 2009/0181550 A1   Jul. 16, 2009

(30) Foreign Application Priority Data

Jan. 12, 2008   (JP) .................................. 2008-005084

(51) Int. Cl.
*H01L 21/31* (2006.01)
*H01L 21/469* (2006.01)
*H01L 21/314* (2006.01)

(52) U.S. Cl. .................... 438/792; 257/E21.269
(58) Field of Classification Search .................... 438/758, 438/763, 778, 786–788, 791–792
See application file for complete search history.

(56) References Cited

U.S. PATENT DOCUMENTS

| | | | |
|---|---|---|---|
| 5,874,368 A | 2/1999 | Laxman et al. | |
| 6,165,916 A | 12/2000 | Muraoka et al. | |
| 6,730,614 B1 * | 5/2004 | Lim et al. | 438/763 |
| 7,294,582 B2 * | 11/2007 | Haverkort et al. | 438/763 |
| 7,300,885 B2 | 11/2007 | Hasebe et al. | |
| 2006/0032443 A1 * | 2/2006 | Hasebe et al. | 118/715 |
| 2006/0207504 A1 | 9/2006 | Hasebe et al. | |
| 2006/0286817 A1 | 12/2006 | Kato et al. | |
| 2008/0274302 A1 | 11/2008 | Hasebe et al. | |

FOREIGN PATENT DOCUMENTS

| | | |
|---|---|---|
| JP | 2-93071 | 4/1990 |
| JP | 6-45256 | 2/1994 |
| JP | 2006-49808 | 2/2006 |
| JP | 2006-49809 | 2/2006 |
| JP | 2006-287195 | 10/2006 |
| JP | 2007-138295 | 6/2007 |
| JP | 2007-281082 | 10/2007 |
| KR | 10-2006-0048541 | 5/2006 |
| KR | 10-2006-0097672 | 9/2006 |

OTHER PUBLICATIONS

Chinese Office Action issued on Jul. 21, 2011 for Application No. 200910000223.7 with English translation.

(Continued)

*Primary Examiner* — Charles Garber
*Assistant Examiner* — Calvin Choi
(74) *Attorney, Agent, or Firm* — Smith, Gambrell & Russell, LLP

(57) ABSTRACT

A film formation process is performed to form a silicon nitride film on a target substrate within a process field configured to be selectively supplied with a first process gas containing a silane family gas and a second process gas containing a nitriding gas. The method is preset to compose the film formation process of a main stage with an auxiliary stage set at one or both of beginning and ending of the film formation process. The main stage includes an excitation period of supplying the second process gas to the process field while exciting the second process gas by an exciting mechanism. The auxiliary stage includes no excitation period of supplying the second process gas to the process field while exciting the second process gas by the exciting mechanism.

13 Claims, 4 Drawing Sheets

OTHER PUBLICATIONS

Korean Office Action mailed on Aug. 2, 2011 for Application No. 10-2009-0001745 with English translation.

Japanese Office Action mailed on Sep. 6, 2011 for Application No. 2008-005084 with English translation.

* cited by examiner

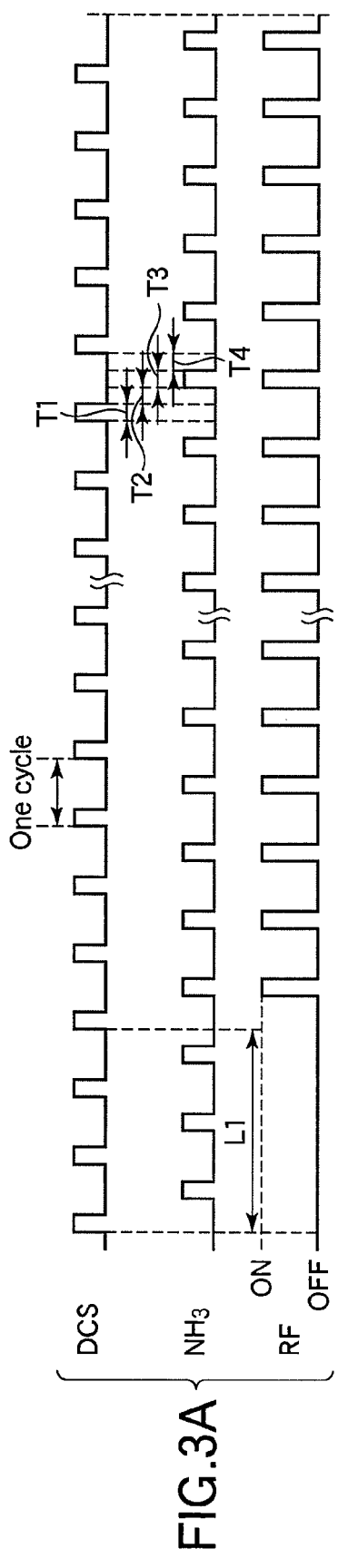
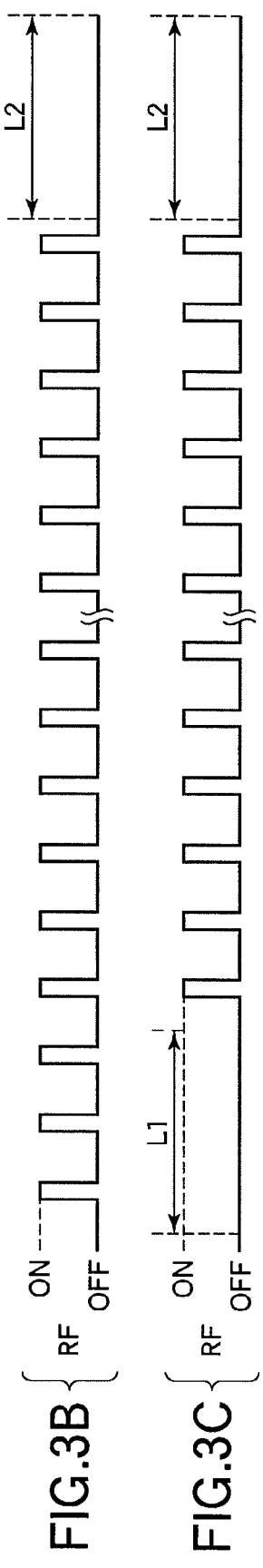
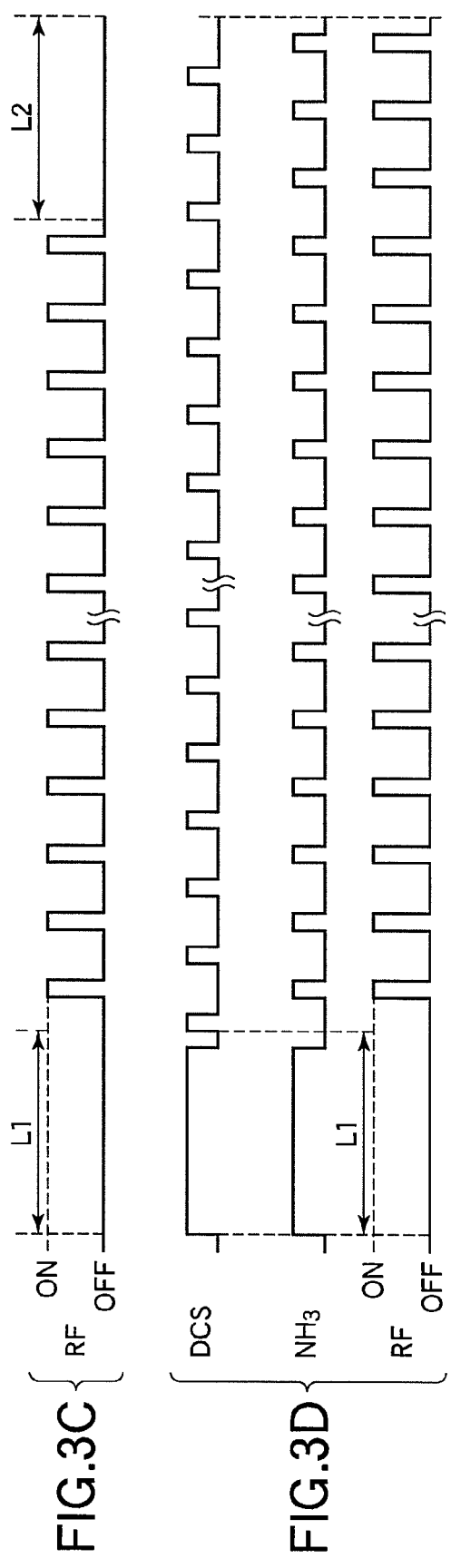
FIG.3A FIG.3B FIG.3C FIG.3D

FILM FORMATION METHOD AND APPARATUS FOR SEMICONDUCTOR PROCESS

BACKGROUND OF THE INVENTION

1. Field of the Invention

The present invention relates to a film formation method and apparatus for a semiconductor process for forming a silicon nitride film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), and SOG (Spin On Glass), $Si_3N_4$ (silicon nitride). Particularly, silicon nitride films are widely used, because they have better insulation properties as compared to silicon oxide films, and they can sufficiently serve as etching stopper films or inter-level insulating films. Further, for the same reason, carbon nitride films doped with boron are sometimes used.

Several methods are known for forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachlorodisilane (HCD: $Si_2Cl_6$), bistertialbutylaminosilane (BTBAS: $SiH_2(NH(C_4H_9))_2$), or $(t-C_4H_9NH)_2SiH_2$, is used as a silicon source gas. For example, a silicon nitride film is formed by thermal CVD using a gas combination of $SiH_2Cl_2+NH_3$ (see U.S. Pat. No. 5,874,368 A) or $Si_2Cl_6+NH_3$. Further, there is also proposed a method for doping a silicon nitride film with an impurity, such as boron (B), to decrease the dielectric constant.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 2-93071 and No. 6-45256 and U.S. Pat. No. 6,165,916 A). In general, this film formation process is called ALD (Atomic layer Deposition) or MLD (Molecular Layer Deposition), which allows a predetermined process to be performed without exposing wafers to a very high temperature.

For example, where dichlorosilane (DCS) and $NH_3$ are supplied as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a film formation method and apparatus for a semiconductor process, which can form a silicon nitride film of high quality while preventing particle generation.

According to a first aspect of the present invention, there is provided a film formation method for a semiconductor process for performing a film formation process to form a silicon nitride film on a target substrate, within a process field inside a process container configured to be selectively supplied with a first process gas containing a silane family gas and a second process gas containing a nitriding gas, and communicating with an exciting mechanism for exciting the second process gas to be supplied, the method being preset to compose the film formation process of a main stage with an auxiliary stage set at one or both of beginning and ending of the film formation process, the main stage being arranged to perform a plurality of main cycles to laminate thin films respectively formed by the main cycles, each of the main cycles comprising: a first supply step of performing supply of the first process gas to the process field while maintaining a shut-off state of supply of the second process gas to the process field; and a second supply step of performing supply of the second process gas to the process field while maintaining a shut-off state of supply of the first process gas to the process field, the second supply step of the main stage including an excitation period of supplying the second process gas to the process field while exciting the second process gas by the exciting mechanism, and the auxiliary stage being arranged to comprise performing supply of the first process gas to the process field, and performing supply of the second process gas to the process field without exciting the second process gas by the exciting mechanism.

According to a second aspect of the present invention, there is provided a film formation apparatus for a semiconductor process, comprising: a process container having a process field configured to accommodate a target substrate; a support member configured to support the target substrate inside the process field; a heater configured to heat the target substrate inside the process field; an exhaust system configured to exhaust gas from the process field; a first process gas supply circuit configured to supply a first process gas containing a silane family gas to the process field; a second process gas supply circuit configured to supply a second process gas containing a nitriding gas to the process field; an exciting mechanism configured to excite the second process gas to be supplied; and a control section configured to control an operation of the apparatus, wherein the control section is preset to execute a film formation method for a semiconductor process for performing a film formation process to form a silicon nitride film on the target substrate within the process field, the method being preset to compose the film formation process of a main stage with an auxiliary stage set at one or both of beginning and ending of the film formation process, the main stage being arranged to perform a plurality of main cycles to laminate thin films respectively formed by the main cycles, each of the main cycles comprising: a first supply step of performing supply of the first process gas to the process field while maintaining a shut-off state of supply of the second process gas to the process field; and a second supply step of performing supply of the second process gas to the process field while maintaining a shut-off state of supply of the first process gas to the process field, the second supply step of the main stage including an excitation period of supplying the second process gas to the process field while exciting the second process gas by the exciting mechanism, and the auxiliary stage being arranged to comprise performing supply of the first process gas to the process field, and performing supply of the second process gas to the process field without exciting the second process gas by the exciting mechanism.

According to a third aspect of the present invention, there is provided a computer readable medium containing program instructions for execution on a processor, which is used for a film formation apparatus for a semiconductor process including a process field inside a process container configured to be selectively supplied with a first process gas containing a silane family gas and a second process gas containing a nitriding gas, and communicating with an exciting mechanism for exciting the second process gas to be supplied, wherein the program instructions, when executed by the processor, cause the film formation apparatus to conduct a film formation method for a semiconductor process for performing a film formation process to form a silicon nitride film on a target substrate within the process field, the method being preset to compose the film formation process of a main stage with an auxiliary stage set at one or both of beginning and ending of the film formation process, the main stage being arranged to perform a plurality of main cycles to laminate thin films respectively formed by the main cycles, each of the main cycles comprising: a first supply step of performing supply of the first process gas to the process field while maintaining a shut-off state of supply of the second process gas to the process field; and a second supply step of performing supply of the second process gas to the process field while maintaining a shut-off state of supply of the first process gas to the process field, the second supply step of the main stage including an excitation period of supplying the second process gas to the process field while exciting the second process gas by the exciting mechanism, and the auxiliary stage being arranged to comprise performing supply of the first process gas to the process field, and performing supply of the second process gas to the process field without exciting the second process gas by the exciting mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3A is a timing chart showing the gas supply and RF (radio frequency) application of a film formation method according to an embodiment of the present invention;

FIGS. 3B and 3C are timing charts showing the RF (radio frequency) application of film formation methods according to modifications;

FIG. 3D is a timing chart showing the gas supply and RF (radio frequency) application of a film formation method according to a modification.

DETAILED DESCRIPTION OF THE INVENTION

Figure 1:
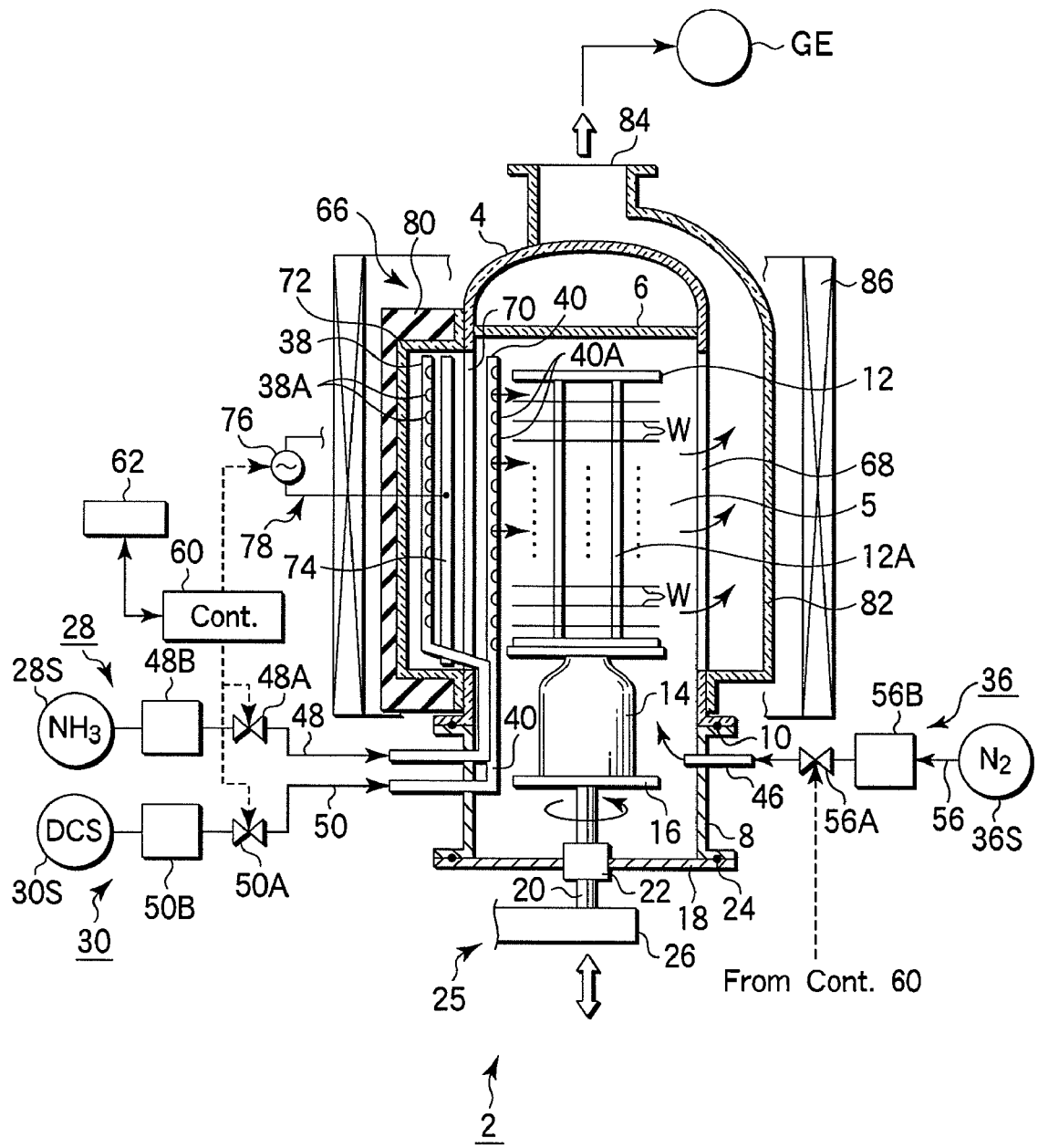
FIG. 1 is a sectional view showing a film formation apparatus (vertical CVD apparatus) according to an embodiment of the present invention.

In the process of developing the present invention, the inventors studied problems of conventional techniques for semiconductor processes, in relation to methods for forming a silicon nitride film. As a result, the inventors have arrived at the findings given below.

Specifically, as described previously, there is a conventional technique arranged to utilize so-called ALD or MLD film formation and to generate plasma by use of radio frequency (RF) when supplying $NH_3$ gas as a nitriding gas, thereby promoting the nitridation reaction. As compared to a process performed without plasma, this process can improve the film formation rate (film formation speed). Further, this process can improve the mobility of electrons or holes by increasing the stress of the deposited silicon nitride film and thereby improve the quality of the deposited silicon nitride film to a large extent.

However, it has been confirmed that, where plasma generation is used, particle generation inside the process container is increased due to an increase in the stress of the deposited silicon nitride film and so forth. Particularly, particles of this kind are generated more on a wall of the process container near plasma. If particles are easily generated, cleaning needs to be frequently performed inside the process container and so the throughput is deteriorated.

In this respect, it has been found that, where ALD or MLD film formation is performed such that an auxiliary stage excluding plasma generation in supplying a nitriding gas is performed before or after a main stage including plasma generation in supplying a nitriding gas, the particle generation can be suppressed. Accordingly, where auxiliary stage is suitably preset in accordance with this concept, a silicon nitride film of high quality can be formed at a high film formation rate while preventing particle generation.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
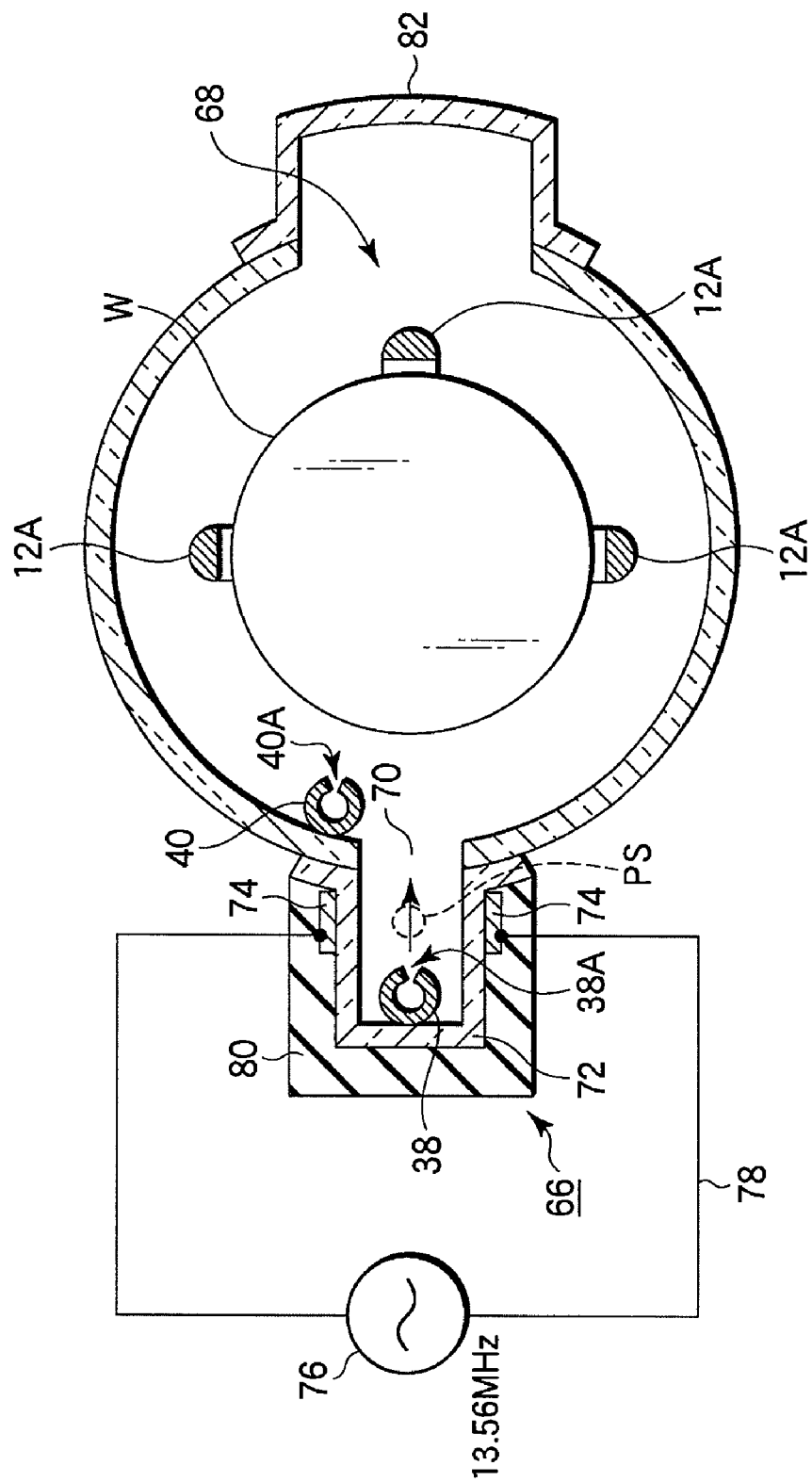
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, and a second process gas containing ammonia ($NH_3$) gas as a nitriding gas. The film formation apparatus 2 is configured to form a silicon nitride film on target substrates in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a purge gas supply circuit 36. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The purge gas supply circuit 36 is arranged to supply an inactive gas, such as $N_2$ gas, as a purge gas. Each of the first and second process gases is mixed with a suitable amount of carrier gas, as needed. However, such a carrier gas will not be mentioned, hereinafter, for the sake of simplicity of explanation.

More specifically, the second and first process gas supply circuits 28 and 30 include gas distribution nozzles 38 and 40, respectively, each of which is formed of a quartz pipe which penetrates the sidewall of the manifold 8 from the outside and then turns and extends upward (see FIG. 1). The gas distribution nozzles 38 and 40 respectively have a plurality of gas spouting holes 38A and 40A, each set of holes being formed at predetermined intervals in the longitudinal direction (the vertical direction) over all the wafers W on the wafer boat 12. Each set of the gas spouting holes 38A and 40A deliver the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 38, 40, and 46 are connected to gas sources 28S, 30S, and 36S of $NH_3$ gas, DCS gas, and $N_2$ gas, respectively, through gas supply lines (gas passages) 48, 50, and 56, respectively. The gas supply lines 48, 50, and 56 are provided with switching valves 48A, 50A, and 56A and flow rate controllers 48B, 50B, and 56B, such as mass flow controllers, respectively. With this arrangement, $NH_3$ gas, DCS gas, and $N_2$ gas can be supplied at controlled flow rates.

A gas exciting section 66 is formed on the sidewall of the process container 4 in the vertical direction. On the side of the process container 4 opposite to the gas exciting section 66, a long narrow exhaust port 68 for vacuum-exhausting the inner atmosphere is formed by cutting the sidewall of the process container 4 in, e.g., the vertical direction.

Specifically, the gas exciting section 66 has a vertically long narrow opening 70 formed by cutting a predetermined width of the sidewall of the process container 4, in the vertical direction. The opening 70 is covered with a quartz cover (plasma generation box) 72 airtightly connected to the outer surface of the process container 4 by welding. The cover 72 has a vertical long narrow shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long narrow electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is selectively excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas is disposed. Specifically, the gas distribution nozzle 40 extends upward on one side of the outside of the opening 70 (in the process container 4). The first process gas containing DCS gas is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

The film formation apparatus 2 further includes a main control section 60 formed of, e.g., a computer, to control the entire apparatus. The main control section 60 can control a film formation process as described below in accordance with process recipes stored in the storage section 62 thereof in advance, with reference to the film thickness and composition of a film to be formed. In the storage section 62, the relationship between the process gas flow rates and the thickness and composition of the film is also stored as control data in advance. Accordingly, the main control section 60 can control the elevating mechanism 25, gas supply circuits 28, 30, and 36, exhaust system GE, gas exciting section 66, heater 86, and so forth, based on the stored process recipes and control data. Examples of a storage medium are a magnetic disk (flexible disk, hard disk (a representative of which is a hard disk included in the storage section 62), etc.), an optical disk (CD, DVD, etc.), a magneto-optical disk (MO, etc.), and a semiconductor memory.

Next, an explanation will be given of a film formation method (so called ALD or MLD film formation) performed in the apparatus shown in FIG. 1. In this film formation method, a silicon nitride film is formed on semiconductor wafers by ALD or MLD. In order to achieve this, a first process gas containing dichlorosilane (DCS) gas as a silane family gas and a second process gas containing ammonia ($NH_3$) gas as a nitriding gas are selectively supplied into the process field 5 accommodating wafers W. Specifically, a film formation process is performed along with the following operations.

<Film Formation Process>

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first and second process gases are intermittently supplied from the respective gas distribution nozzles 40 and 38 at controlled flow rates.

The first process gas containing DCS gas is supplied from the gas spouting holes 40A of the gas distribution nozzle 40 to form gas flows parallel with the wafers W on the wafer boat 12. While being supplied, the DCS gas is activated by the heating temperature to the process field 5, and molecules of the DCS gas and molecules and atoms of decomposition products generated by decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. When the second process gas is supplied, the gas exciting section 66 is set in the ON-state or OFF-state, depending on main and auxiliary stages, as described later.

When the gas exciting section 66 is set in the ON-state, the second process gas is excited and partly turned into plasma when it passes through the plasma generation area PS between the pair of electrodes 74. At this time, for example, radicals (activated species), such as $N^*$, $NH^*$, $NH_2^*$, and $NH_3^*$, are produced (the symbol [*] denotes that it is a radical). On the other hand, when the gas exciting section 66 is set in the OFF-state, the second process gas passes, mainly as gas molecules, through the gas exciting section 66. The radicals or gas molecules flow out from the opening 70 of the gas exciting section 66 toward the center of the process container 4, and are supplied into gaps between the wafers W in a laminar flow state.

Radicals derived from the $NH_3$ gas excited by plasma or molecules of the $NH_3$ gas and molecules and atoms of decomposition products generated by decomposition due to activation by the heating temperature to the process field 5 react with molecules and so forth of DCS gas adsorbed on the surface of the wafers W, so that a thin film is formed on the wafers W. Alternatively, when the DCS gas flows onto radicals derived from the $NH_3$ gas or molecules and atoms of decomposition products derived from the $NH_3$ gas and adsorbed on the surface of the wafers W, the same reaction is caused, so a silicon nitride film is formed on the wafers W. When the gas exciting section 66 is set in the ON-state, the film formation is developed at an increased reaction rate. On the other hand, when the gas exciting section 66 is set in the OFF-state, the film formation is developed at a decreased reaction rate.

FIG. 3A is a timing chart showing the gas supply and RF (radio frequency) application of a film formation method according to an embodiment of the present invention. FIG. 3A shows conditions in the whole period of a film formation process performed on one batch of wafers. As shown in FIG. 3A, the film formation method according to this embodiment is arranged such that the film formation process is formed of a certain period (auxiliary stage) set at the beginning of the film formation process and a period set thereafter (main stage). The main stage is composed of cycles in which the second process gas containing $NH_3$ gas is excited by the gas exciting section 66. The auxiliary stage is composed of a cycle or cycles in which the second process gas is not excited by the gas exciting section 66. Each of the cycles of the main and auxiliary stages is formed of first to fourth steps T1 to T4. Accordingly, a cycle comprising the first to fourth steps T1 to T4 is repeated a number of times, and thin films of silicon nitride formed by respective cycles are laminated, thereby arriving at a silicon nitride film having a target thickness.

Specifically, the first step T1 is arranged to perform supply of the first process gas (denoted as DCS in FIG. 3A) to the process field 5, while maintaining the shut-off state of supply of the second process gas (denoted as $NH_3$ in FIG. 3A) to the process field 5. The second step T2 is arranged to maintain the shut-off state of supply of the first and second process gases to the process field 5. The third step T3 is arranged to perform supply of the second process gas to the process field 5, while maintaining the shut-off state of supply of the first process gas to the process field 5. The fourth step T4 is arranged to maintain the shut-off state of supply of the first and second process gases to the process field 5.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while maintaining the shut-off state of supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first and second process gases. However, where supplying each of the first and second process gases is performed along with vacuum-exhausting the process container 4, the interior of the process container 4 can be continuously vacuum-exhausted over the entirety of the first to fourth steps T1 to T4.

In the third step T3 of the main stage, the RF power supply 76 is set in the ON-state to turn the second process gas into plasma by the gas exciting section 66, so as to supply the second process gas in an activated state to the process field 5. In the third step T3 of the auxiliary stage, the RF power supply 76 is set in the OFF-state not to turn the second process gas into plasma by the gas exciting section 66, while supplying the second process gas to the process field 5. However, the heating temperature set by the heater 86 to the process field 5 remains the same in the main and auxiliary stages, i.e., it is essentially not changed depending on the stages.

In FIG. 3A, the first step T1 is set to be within a range of about 2 to 10 seconds, the second step T2 is set to be within a range of about 5 to 15 seconds, the third step T3 is set to be within a range of about 10 to 20 seconds, and the fourth step T4 is set to be within a range of about 5 to 15 seconds. As an average value provided by the main and auxiliary stages, the film thickness obtained by one cycle of the first to fourth steps T1 to T4 is about 0.10 to 0.13 nm. Accordingly, for example, where the target film thickness is 50 nm, the cycle is repeated about 450 to 500 times. However, these values of time and thickness are merely examples and thus are not limiting.

The third step T3 of the main stage may be modified in relation to the ON-state of an RF power supply in the $NH_3$ gas supply step. For example, in a modification, halfway through the third step T3, the RF power supply 76 is set in the ON-state to supply the second process gas in an activated state to the process field 5 during a sub-step T3b. Specifically, in this case, the RF power supply 76 is turned on after a predetermined time $\Delta t$ passes, to turn the second process gas into plasma by the gas exciting section 66, so as to supply the second process gas in an activated state to the process field 5 during the sub-step T3b. The predetermined time $\Delta t$ is defined as the time necessary for stabilizing the flow rate of $NH_3$ gas, which is set at, e.g., about 5 seconds. Since the RF power supply is turned on to generate plasma after the flow rate of the second process gas is stabilized, the uniformity of radical concentration among the wafers W (uniformity in the vertical direction) is improved.

The process conditions of the film formation process are as follows. The flow rate of DCS gas is set to be within a range of 50 to 2,000 sccm, e.g., at 1,000 sccm (1 slm). The flow rate of $NH_3$ gas is set to be within a range of 500 to 5,000 sccm, e.g., at 1,000 sccm. The process temperature is lower than ordinary CVD processes, and is set to be within a range of 200 to 700° C., preferably of 300 to 700° C., and more preferably of 450 to 630° C. If the process temperature is lower than 200° C., essentially no film is deposited because hardly any reaction is caused. If the process temperature is higher than 700° C., a low quality CVD film is deposited, and existing films, such as a metal film, suffer thermal damage. The temperature of the process field 5 may be changed to some extent depending on the presence and absence of plasma in the main and auxiliary stages. However, the heating temperature set by the heater 86 to the process field 5 remains essentially the same in the main and auxiliary stages.

The process pressure is set to be within a range of 13 Pa (0.1 Torr) to 13,300 Pa (100 Torr), preferably of 40 Pa (0.3 Torr) to 266 Pa (2 Torr), and more preferably of 93 P (0.7 Torr) to 107 P (0.8 Torr). For example, the process pressure is set at 1 Torr during the first step (DCS supply step) T1, and at 0.3 Torr during the third step ($NH_3$ supply step) T3. If the process pressure is lower than 13 Pa, the film formation rate becomes lower than the practical level. Where the process pressure does not exceed 13,300 Pa, the reaction mode on the wafers W is mainly of an adsorption reaction, and thus a high quality thin film can be stably deposited at a high film formation rate, thereby attaining a good result. However, if the process pressure exceeds 13,300 Pa, the reaction mode is shifted from the adsorption reaction to a vapor-phase reaction, which then becomes prevailing on the wafers W. This is undesirable, because the inter-substrate uniformity and planar uniformity of the film are deteriorated, and the number of particles due to the vapor-phase reaction suddenly increases.

According to the film formation method described above, the auxiliary stage L1 set at the beginning of the film formation process is arranged to generate no plasma in supplying $NH_3$ gas, so as to form an SiN film by means of plasma-less thermal decomposition. The main stage set thereafter is performed to form an SiN film by use of plasma. In FIG. 3A, the auxiliary stage is composed of three cycles, but this number of cycles is not limited to a specific number as long as it is set to be one or more. In practice, this number of cycles may be set larger than three.

When the film formation process is performed, by-product films containing SiN as the main component are deposited on the inner surface of the process container 4, particularly, on the inner surface of the cover 72 of the gas exciting section 66. Of these by-product films, a by-product film formed by use of plasma during the main stage of the film formation process can easily generate particles, as described above. However, when the auxiliary stage L1 set at the beginning of the film formation process is performed on the next batch of wafers, the by-product film that can easily generate particles is covered with a by-product film newly formed by the plasma-less stage. Consequently, the by-product film formed by use of plasma is prevented from generating particles therefrom. In other words, an SiN by-product film formed by use of plasma is a thin film with a high stress and thus can be easily peeled. However, where this film is covered with an SiN by-product film formed by plasma-less thermal decomposition (which has a lower film stress and thus can be hardly peeled), the particle generation is suppressed considerably. This method is applicable not only to a film formation process on wafers but also to a pre-coating process for forming a thin film on the inner surface of the process container.

Figure 4A:
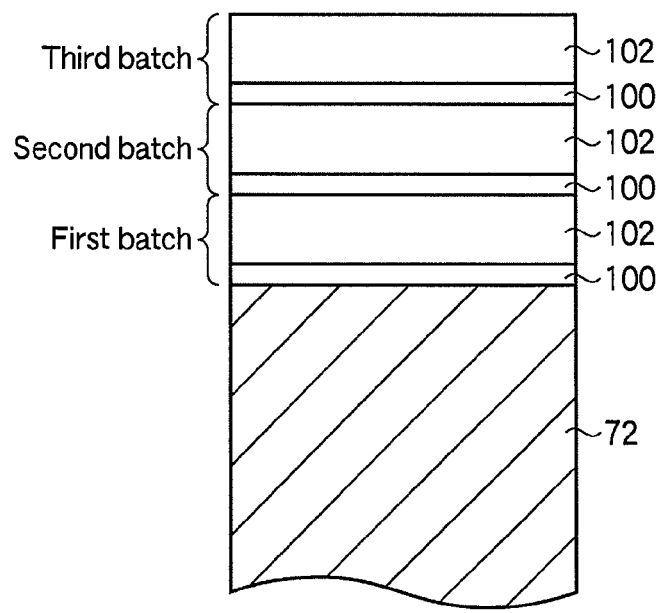
FIGS. 4A and 4B are sectional views schematically showing a by-product film deposited inside a gas exciting section.
Figure 4B:
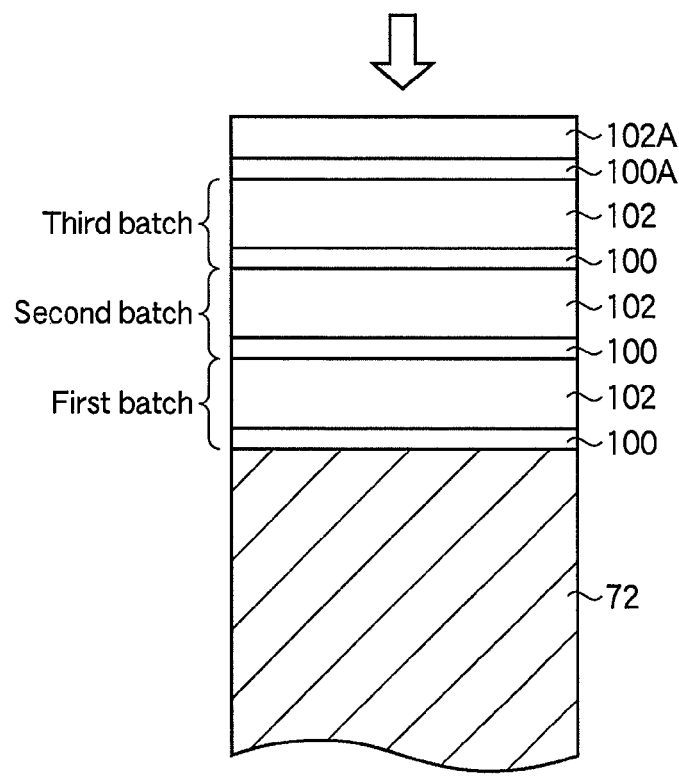

FIGS. 4A and 4B are sectional views schematically showing a by-product film deposited inside a gas exciting section. As shown in FIG. 4, when the film formation process is performed on each batch of wafers, one SiN film formed by thermal decomposition (i.e., a thermal SiN by-product film 100) and one SiN film formed by use of plasma (i.e., a plasma SiN by-product film 102) are alternately laminated. FIG. 4A shows a state after the film formation process for the third batch is finished. It should be noted that, in practice, after a cleaning process of the process container 4 is performed, a pre-coating process is performed to form a thin film by supplying the film formation gas into the process container 4 accommodating no wafers therein. However, the pre-coating film thus formed is not shown in FIGS. 4A and 4B.

Then, the film formation process for the fourth batch is performed, as described above, and the thermal SiN by-product film 100A is first formed by plasma-less thermal decomposition, as shown in FIG. 4B. Then, the plasma SiN by-product film 102A is formed thereon by use of plasma.

Specifically, the plasma SiN by-product film 102 on the lower side, which has a high film stress and thus can be easily peeled to generate particles, is coated with the thermal SiN by-product film 100A having a lower film stress. Consequently, the particle generation from the plasma SiN by-product film 102 is suppressed considerably.

The thickness of the SiN thin film formed on the wafers W by the auxiliary stage L1 is preset to be 0.1 nm or more. In this case, the thermal SiN by-product film 100 is also formed to have a thickness of 0.1 nm or more. If this film thickness is smaller than 0.1 nm, the film may have difficulties in reliably coating the entirety of the plasma SiN by-product film 102 on the lower side, and deteriorate the effect of preventing particle generation.

Further, the thickness of the SiN thin film formed on the wafers W by the auxiliary stage L1 is preset to be 20% or less of the total thickness of the SiN product film formed by the film formation process, i.e., the sum of the thicknesses of the thermal SiN film and plasma SiN film. In this case, the thermal SiN by-product film 100 is also formed to have a thickness of 20% or less of the sum of the thicknesses of the thermal SiN by-product film 100 and plasma SiN by-product film 102. If this film thickness is larger than 20% of the total thickness, the SiN product film formed on the wafers W loses the film characteristics of the plasma SiN film from its quality and is adversely affected by the film characteristics of the thermal SiN film.

The mechanism of preventing particle generation by the film formation method described above depends on the stress level of by-product films. It was confirmed by actual measurement of film stress that the plasma-less thermal SiN by-product film 100 had a stress of about 0.3 GPa and the plasma SiN by-product film 102 had a stress of 0.6 GPa or more.

Where the film formation method described above is used, particle generation is decreased to the minimum, and a silicon nitride film thereby formed is provided with film quality, as a whole, equivalent to that of a film formed by use of plasma in all the $NH_3$ gas supply steps. Specifically, it is possible to greatly decrease the dielectric constant of the deposited silicon nitride film, and to greatly improve the etching resistance of the film in dry etching.

Further, since the particle generation is suppressed, cleaning can be less frequently performed by that much and so the throughput is improved.

Specifically, it is possible to considerably decrease the frequency of a dry cleaning process that generally requires 45 minutes.

Experiment

In order to examine the effect of preventing particle generation according to the embodiment, a film formation process was performed to form an SiN film. In this experiment, a film formation process was first performed in the film formation apparatus 2 shown in FIG. 1 to form an SiN film to have a cumulative film thickness of 500 nm (this film formation process was performed entirely by an ALD method using plasma). Then, a film formation process is performed on semiconductor wafers in accordance with the embodiment described above to form an SiN film having a thickness of 50 nm.

Two experiments were performed each by a film formation process in accordance with the embodiment. The first experiment was arranged such that the thermal SiN film initially formed had a thickness of 3.5 nm (corresponding to 60 cycles of RF application) and the plasma ALD-SiN film then formed had the rest thickness of 46.5 nm. The second experiment was arranged such that the thermal SiN film initially formed had a thickness of 5 nm (corresponding to 70 cycles of RF application) and the plasma ALD-SiN film then formed had the rest thickness of 40 nm.

As a result, it was confirmed by the two experiments described above that the particle generation was considerably decreased. Further, it was confirmed by the two experiments described above that an SiN film deposited on the surface of the semiconductor wafers had high quality.

Modification

As regards the RF power application, as shown in FIG. 3A, the embodiment described above includes the auxiliary stage L1, which generates no plasma in the nitriding gas supply step, at the beginning of the film formation process. FIGS. 3B and 3C are timing charts showing the RF (radio frequency) application of film formation methods according to modifications.

The modification shown in FIG. 3B includes a certain period (auxiliary stage) L2, which generates no plasma in the nitriding gas supply step, at the ending of the film formation process. This period L2 has the same length as the period L1 described above. In this case, a plasma SiN by-product film 102 is coated with a thermal SiN by-product film 100 formed at the ending of the film formation process. Accordingly, this modification can also provide the same function and effect as those of the embodiment described above.

The modification shown in FIG. 3C includes a certain period (auxiliary stage) L1 and a certain period (auxiliary stage) L2, which generate no plasma in the nitriding gas supply step, respectively at both of the beginning and ending of the film formation process. This modification can also provide the same function and effect as those of the embodiment described above.

In the embodiment and modifications, the auxiliary stage at the beginning and/or ending of the film formation process is arranged to alternately supply the silane family gas and nitriding gas. FIG. 3D is a timing chart showing the gas supply and RF (radio frequency) application of a film formation method according to a modification. In the modification shown in FIG. 3D, the auxiliary stage L1 is arranged to simultaneously supply the silane family gas and nitriding gas to perform film formation by an ordinary thermal CVD (plasma-less). The main stage of the film formation process other than the auxiliary stage is performed in the same way as described above. This modification can also provide the same function and effect as those of the film formation method shown in FIG. 3A.

In the embodiment described above, for example, the first process gas contains DCS gas as a silane family gas. In this respect, the silane family gas may contain at least one gas selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertial-butylaminosilane (BTBAS), trimethylsilane (TMS), dimethylsilane (DMS), monomethylamine (MMA), and tridimethylaminosilane (3DMAS).

In the embodiment described above, for example, the second process gas contains $NH_3$ gas as a nitriding gas. In this respect, the nitriding gas may contain at least one gas selected from the group consisting of ammonia ($NH_3$), nitrogen ($N_2$), dinitrogen oxide ($N_2O$), and nitrogen oxide (NO).

In the embodiment described above, a silicon nitride film to be formed may be provided with components, such as boron (B) and/or carbon (C). In this case, each cycle of the film formation process further comprises a step or steps of supplying a doping gas and/or a carbon hydride gas. A boron-containing gas used for doping boron may contain at least one gas selected from the group consisting of $BCl_3$, $B_2H_6$, $BF_3$, and $B(CH_3)_3$. A carbon hydride gas used for adding carbon may contain at least one gas selected from the group consisting of acetylene, ethylene, methane, ethane, propane, and butane.

A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A film formation method for a semiconductor process for forming a silicon nitride film as a product film on a plurality of target substrates supported at intervals in a vertical direction on a support member within a process field inside a process container configured to be selectively supplied with a silicon source gas and a nitriding gas and communicating with an exciting mechanism for generating plasma to excite the nitriding gas, the method performing a film formation process on batches of target substrates continuously one batch by one batch and composing the film formation process of a main stage with an auxiliary stage, the main stage performing a plurality of main cycles to laminate thin films respectively formed by the main cycles, each of the main cycles comprising:

a first supply step of supplying the silicon source gas to the process field while maintaining a shut-off state of supply of the nitriding gas to the process field; and a second supply step of supplying the nitriding gas to the process field while maintaining a shut-off state of supply of the silicon source gas to the process field, the second supply step of the main stage including an excitation period of supplying the nitriding gas to the process field while exciting the nitriding gas by means of plasma generated by the exciting mechanism, and the auxiliary stage performing a plurality of auxiliary cycles to laminate thin films respectively formed by the auxiliary cycles, each of the auxiliary cycles comprising:

a first supply step of supplying the silicon source gas to the process field while maintaining a shut-off state of supply of the nitriding gas to the process field; and a second supply step of supplying the nitriding gas to the process field while maintaining a shut-off state of supply of the silicon source gas to the process field, the second supply step of the auxiliary stage having no excitation period of exciting the nitriding gas by means of plasma generated by the exciting mechanism, wherein a by-product film is deposited on an inner surface of the process container by the film formation process, and the by-product film includes a main stage by-product film deposited by the main stage and having a higher stress due to use of the plasma and an auxiliary stage by-product film deposited by the auxiliary stage and having a lower stress due to the nonuse of plasma, the auxiliary stage is at only the beginning or the ending of the film formation process, or at only both the beginning and the ending of the film formation process, so as to form a by-product film structure on the inner surface of the process container by performing the film formation process on the batches of target substrates continuously one batch by one batch such that first portions corresponding to the main stage by-product film and second portions corresponding to the auxiliary stage by-product film are alternately deposited to suppress generation of particles from the first portions corresponding to the main stage by-product film, and the number of main cycles forming the main stage is larger than the number of auxiliary cycles forming the auxiliary stage such that the auxiliary stage provides part of the silicon nitride film thereby formed with a thickness of 20% or less of a total thickness of the silicon nitride film to prevent the silicon nitride film from being adversely affected in quality by the auxiliary stage.

2. The method according to claim 1, wherein the auxiliary stage provides part of the silicon nitride film thereby formed with a thickness of 0.1 nm or more.

3. The method according to claim 1, wherein the first and second supply steps of the main stage set the process field at a temperature of 200 to 700.degree. C.

4. The method according to claim 1, wherein the main stage and the auxiliary stage use essentially the same set temperature for heating the process field.

5. The method according to claim 1, wherein the first and second supply steps of the main stage set the process field at a pressure of 13 to 13,300 Pa.

6. The method according to claim 1, wherein each of the main cycles and the auxiliary cycles further comprises first and second intermediate steps of exhausting gas from the process field while maintaining a shut-off state of supply of the silicon source gas and the nitriding gas to the process field, between the first and second supply steps, and after the second supply step, respectively.

7. The method according to claim 6, wherein each of the main cycles and the auxiliary cycles continuously exhausts gas from the process field through the first supply step, the first intermediate step, the second supply step, and the second intermediate step.

8. The method according to claim 6, wherein each of the first and second intermediate steps includes a period of supplying a purge gas, consisting of an inactive gas, to the process field.

9. The method according to claim 6, wherein the first and second supply steps of each of the main stage and the auxiliary stage set the process field at a temperature of 300 to 700° C. and at a pressure of 40 to 266 Pa.

10. The method according to claim 9, wherein the nitriding gas is ammonia.

11. The method according to claim 1, wherein the silicon source gas is selected from the group consisting of dichlorosilane, hexachlorodisilane, monosilane, disilane, hexamethyldisilazane, tetrachlorosilane, disilylamine, trisilylamine, bistertialbutylaminosilane, trimethylsilane, dimethylsilane, monomethylamine, and tridimethylaminosilane, and the nitriding gas is selected from the group consisting of ammonia, dinitrogen oxide, and nitrogen oxide.

12. The method according to claim 11, wherein each of the main cycles further comprises a step or steps of supplying at least one gas selected from the group consisting of a doping gas and a carbon hydride gas.

13. A computer readable, non-transitory storage medium containing program instructions for execution on a processor, which is used for a film formation apparatus for a semiconductor process including a process field inside a process container configured to be selectively supplied with a silicon source gas and a nitriding gas and communicating with an exciting mechanism for generating plasma to excite the nitriding gas, wherein the program instructions, when executed by the processor, cause the film formation apparatus to conduct a film formation method for a semiconductor process for forming a silicon nitride film as a product film on a plurality of target substrates supported at intervals in a vertical direction on a support member within the process field, the method performing a film formation process on batches of target substrates continuously one batch by one batch and composing the film formation process of a main stage with an auxiliary stage, the main stage performing a plurality of main cycles to laminate thin films respectively formed by the main cycles, each of the main cycles comprising:

a first supply step of supplying the silicon source gas to the process field while maintaining a shut-off state of supply of the nitriding gas to the process field; and a second supply step of supplying the nitriding gas to the process field while maintaining a shut-off state of supply of the silicon source gas to the process field, the second supply step of the main stage including an excitation period of supplying the nitriding gas to the process field while exciting the nitriding gas by means of plasma generated by the exciting mechanism, and the auxiliary stage performing a plurality of auxiliary cycles to laminate thin films respectively formed by the auxiliary cycles, each of the auxiliary cycles comprising:

a first supply step of supplying the silicon source gas to the process field while maintaining a shut-off state of supply of the nitriding gas to the process field; and a second supply step of supplying the nitriding gas to the process field while maintaining a shut-off state of supply of the silicon source gas to the process field, the second supply step of the auxiliary stage having no excitation period of exciting the nitriding gas by means of plasma generated by the exciting mechanism, wherein a by-product film is deposited on an inner surface of the process container by the film formation process, and the by-product film includes a main stage by-product film deposited by the main stage and having a higher stress due to use of the plasma and an auxiliary stage by-product film deposited by the auxiliary stage and having a lower stress due to the nonuse of plasma, the auxiliary stage is at only the beginning or the ending of the film formation process, or at only both the beginning and the ending of the film formation process, so as to form a by-product film structure on the inner surface of the process container by performing the film formation process on the batches of target substrates continuously one batch by one batch such that first portions corresponding to the main stage by-product film and second portions corresponding to the auxiliary stage by-product film are alternately deposited to suppress generation of particles from the first portions corresponding to the main stage by-product film, and the number of main cycles forming the main stage is larger than the number of auxiliary cycles forming the auxiliary stage such that the auxiliary stage provides part of the silicon nitride film thereby formed with a thickness of 20% or less of a total thickness of the silicon nitride film to prevent the silicon nitride film from being adversely affected in quality by the auxiliary stage.

* * * * *